United States Patent
Ando et al.

(10) Patent No.: US 9,761,655 B1
(45) Date of Patent: Sep. 12, 2017

(54) STACKED PLANAR CAPACITORS WITH SCALED EOT

(71) Applicant: International Business Machines Corporation, Armonk, NY (US)

(72) Inventors: Takashi Ando, Tuckahoe, NY (US); Lawrence A. Clevenger, Rhinebeck, NY (US); Hemanth Jagannathan, Niskayuna, NY (US); Roger A. Quon, Rhinebeck, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/186,919

(22) Filed: Jun. 20, 2016

(51) Int. Cl.
| | |
|---|---|
| H01L 49/02 | (2006.01) |
| H01L 21/20 | (2006.01) |
| H01L 29/06 | (2006.01) |
| H01L 21/768 | (2006.01) |
| H01L 23/522 | (2006.01) |
| H01L 23/532 | (2006.01) |

(52) U.S. Cl.
CPC ........ *H01L 28/75* (2013.01); *H01L 21/76879* (2013.01); *H01L 21/76883* (2013.01); *H01L 23/5226* (2013.01); *H01L 23/53257* (2013.01); *H01L 29/0649* (2013.01)

(58) Field of Classification Search
CPC . H01L 28/40; H01L 27/0788; H01L 27/0676; H01L 27/0755; H01L 27/0777; H01L 27/0794
See application file for complete search history.

(56) References Cited

U.S. PATENT DOCUMENTS

| | | | |
|---|---|---|---|
| 4,685,197 A | 8/1987 | Tigelaar et al. | |
| 4,827,323 A | 5/1989 | Tigelaar et al. | |
| 5,583,359 A | 12/1996 | Ng et al. | |
| 6,838,717 B1 | 1/2005 | Yen et al. | |
| 7,023,044 B2 | 4/2006 | Kohyama et al. | |
| 7,180,120 B2 | 2/2007 | Won | |
| 7,187,027 B2 | 3/2007 | Kohyama et al. | |
| 7,338,879 B2 | 3/2008 | Won | |
| 7,943,476 B2 | 5/2011 | Bang et al. | |
| 9,257,498 B1* | 2/2016 | Hsu | H01L 28/60 |
| 2006/0177981 A1* | 8/2006 | Hierlemann | H01L 23/5223 438/253 |
| 2010/0224960 A1 | 9/2010 | Fischer | |
| 2013/0270675 A1* | 10/2013 | Childs | H01L 23/5226 257/532 |
| 2016/0104762 A1* | 4/2016 | Triyoso | H01L 27/0805 257/532 |

FOREIGN PATENT DOCUMENTS

JP 4956355 B2 6/2012

* cited by examiner

*Primary Examiner* — Benjamin Sandvik
*Assistant Examiner* — Damon Hillman
(74) *Attorney, Agent, or Firm* — Cantor Colburn LLP; Vazken Alexanian

(57) ABSTRACT

Stacked planar capacitor structures and methods of fabricating the same generally include stacking two or more capacitors with three electrodes by sharing a middle electrode, wherein each capacitor has a different area. The stacked structure does not include step heights, which permits fabrication of multiple structures where desired.

20 Claims, 7 Drawing Sheets

STACKED PLANAR CAPACITORS WITH SCALED EOT

BACKGROUND

The present invention relates to a capacitor structure for an integrated circuit and a method of fabrication thereof, with particular application to stacked planar capacitors for low leakage applications.

Modern integrated circuits, such as microprocessors, use numerous passive components such as resistors and capacitors. In one application, decoupling capacitors are used to reduce undesired noise signals from the power supply. For example, conventional embedded DRAM and decoupling capacitors typically utilize three dimensional structures to increase the surface area and to obtain large capacitance values. One method of adding decoupling capacitors to the microprocessor is by forming them on the package substrate. However, this method requires electrical routing between the capacitors and microprocessor, which increases thickness and cost of the package substrate. Furthermore, the electrical routing to the capacitors on the package increases inductance.

Decoupling capacitors have also been formed by on-chip techniques. For example, decoupling capacitors such as gate oxide capacitors or finger comb capacitors are often formed in the lower metal layers of the backend interconnect stack. However, the capacitance output of gate oxide or finger comb capacitors is limited by high voltage breakdown and layout factors.

Other methods include forming the decoupling capacitors in the passivation structure at the back end of line (BEOL). For example, US Pat. Pub. No. 2010/0224960 to Fischer et al. discloses the formation of fin like capacitors in BEOL. U.S. Pat. No. 5,583,359 to Ng et al. is another example of forming decoupling capacitors in the passivation structure in BEOL. However, these types of devices are prone to leakage and reliability issues due to the step height differences in the dielectric of the prior art capacitor structures, which makes multiple stacking of the same structure difficult. With regard to Ng, the dielectric between electrodes is not flat at the edges, which leads to current leakage and reliability issues. Current leakage necessitates an increase in dielectric thickness, which is undesirable for capacitance enhancement and higher chip area utilization.

Prior Art FIGS. 1-2 are transmission electron microscopic images of a stacked MIM capacitor including two planar capacitors that are stacked in BEOL, which include step height differences. As shown more clearly in FIG. 2, the step height at the edge can result in weak spots in the high k dielectric layer resulting in current leakage and reliability issues. At a minimum, capacitor structures including steps such as the type shown prevent aggressive EOT scaling and large area utilization. Moreover, the step height makes multiple stacking of the same structure difficult.

SUMMARY OF THE INVENTION

The present invention provides a three-dimensional (3D) via stacked planar capacitors having reduced substrate space requirement and improved reliability over conventional capacitors mentioned above. This invention also provides methods for forming such a capacitor.

In one embodiment, the stacked planar capacitor structure includes at least two capacitors. A first capacitor is formed on an interlevel or an intralevel dielectric of BEOL. The first capacitor includes a first layer defined by a first bottom electrode and a first isolation region, wherein the first electrode and the first isolation region are of equal thickness; a first high k dielectric layer offset from and overlaying a portion of the first bottom electrode, a middle electrode vertically aligned with and of an equal width as the first high k dielectric layer; and a second isolation region abutting the middle electrode having a thickness equal to the middle electrode and the first high k dielectric layer such that the second isolation region has an upper surface coplanar with the middle electrode. A second capacitor includes a third layer defined by a second bottom electrode; the middle electrode; and a second high k dielectric layer intermediate the third layer and the middle electrode; the second high k dielectric layer offset from and overlaying a portion of the middle electrode, wherein the second bottom electrode is vertically aligned with and of an equal width as the second high k dielectric layer and the first bottom electrode, wherein the first and second capacitors share the middle electrode.

In another embodiment, the stacked planar capacitor structure includes a first capacitor formed on an interlevel or an intralevel dielectric of BEOL including a first layer defined by a first bottom electrode and a first isolation region, wherein the first electrode and the first isolation region are of equal thickness; a first high k dielectric layer offset from and overlaying a portion of the first bottom electrode; a middle electrode vertically aligned with and of an equal width as the first high k dielectric layer; and a second isolation region abutting the middle electrode having a thickness equal to the middle electrode and the first high k dielectric layer such that the second isolation region has an upper surface coplanar with the middle electrode. A second capacitor includes a third layer defined by a second bottom electrode; the middle electrode; and a second high k dielectric layer intermediate the third layer and the middle electrode; the second high k dielectric layer offset from and overlaying a portion of the middle electrode, wherein the second bottom electrode is vertically aligned with and of an equal width as the second high k dielectric layer and the first bottom electrode, wherein the first and second capacitors share the middle electrode.

A method of forming a stacked planar capacitor at BEOL, includes providing a substrate including a first dielectric layer; forming a first electrode and a first isolation region on the first dielectric layer, wherein the first electrode has a thickness equal to the first isolation region; forming a first high-k dielectric material layer on the first electrode and the first isolation region layer; forming a second electrode and a second isolation region on the first high dielectric layer, wherein the second electrode has a thickness equal to the second isolation region; forming a second high-k dielectric material layer on the second electrode and the second isolation region, wherein the second electrode overlays a portion of the first electrode; forming a third electrode on the second high dielectric layer, wherein the third electrode has a thickness equal to a thickness of the second isolation region, and wherein the third electrode has a width equal to the first electrode and is vertically aligned therewith; forming a second dielectric layer on the third electrode and an exposed portion of the second high k dielectric layer; forming a first vertical via to the first and third electrodes; forming a second vertical via to the second electrode, and filling the first and second vertical vias with a conductive material to form the stacked planar capacitor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Prior Art

Prior Art

Figure 1:
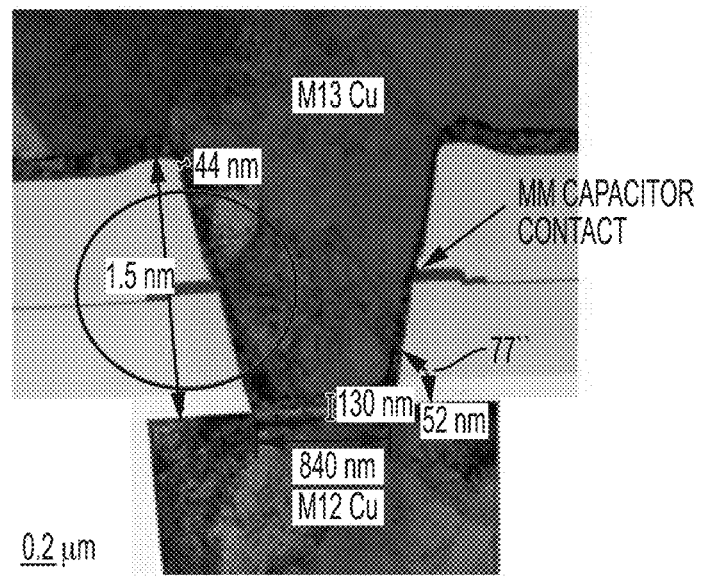
FIG. 1 is a transmission electron micrograph of a semiconductor device including a via extending between metal levels and a prior art stacked MIM decoupling capacitor.
Figure 2:
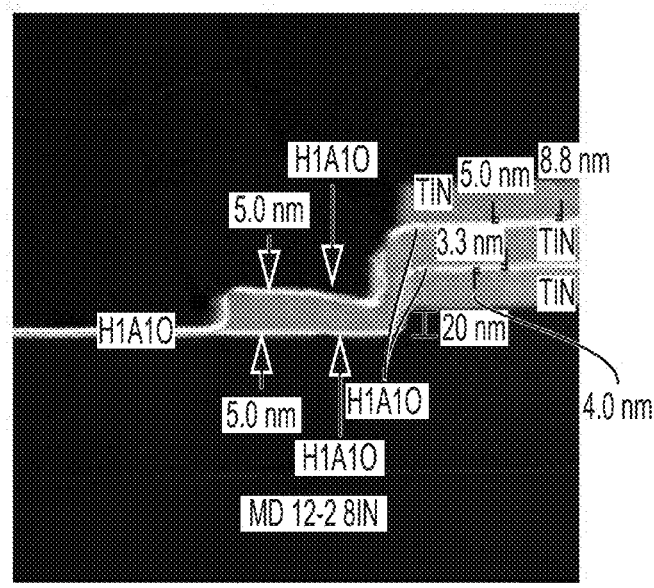
FIG. 2 is a transmission electron micrograph of a magnified view of the stacked MIM decoupling capacitor of the semiconductor device of prior art FIG. 1.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

Disclosed herein are methods and structures for forming one or more stacked planar electrode capacitors with scaled equivalent oxide thickness (EOT). The methods and structures overcome the problems associated in the prior art by eliminating step heights for the dielectric layer so as to enable aggressive EOT scaling. The stacked planar configuration in accordance with the present invention as will be discussed below eliminates weak spots observed with stacked capacitors including non-planar dielectrics. In the present disclosure, the high k dielectric layer between electrodes can further function as an etch stop layer for subsequent planar electrode/isolation layer deposition. As will be apparent to those skilled in the art, the fabrication methods and stacked planar capacitor structures enables stacking of three or more electrodes, thereby providing capacitance enhancement. Multiple repetition of the structure is possible without causing additional topography, which is a significant advantage over the prior art.

Figure 3:
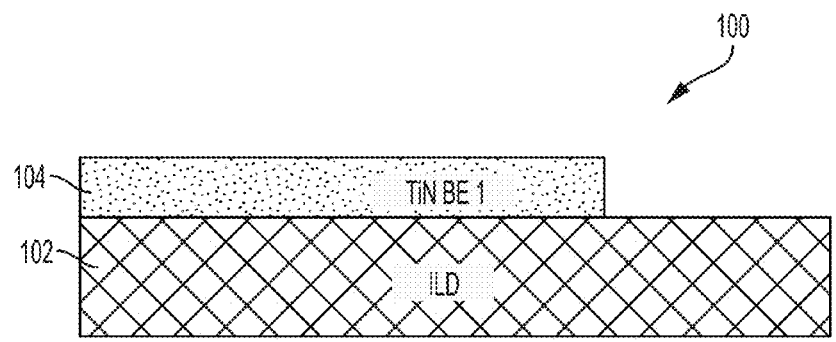
FIG. 3 illustrates a cross-sectional view of 3D via stacked planar capacitors after an initial processing stage, in accordance with embodiments of the present invention.

Referring now to FIG. 3, a structure 100 is provided, which includes formation of the first bottom electrode (BE1). The structure 100 includes a dielectric layer 102 including a planar top surface. The dielectric layer 102 may be any interlevel or intralevel dielectrics utilized at the back end of line (BEOL). As used herein, BEOL generally begins when the first layer of metal is deposited on the wafer. As such, BEOL typically includes contacts, insulating layers, metal levels, and bonding sites for chip-to-package connections. The dielectric layers used in the BEOL may include inorganic dielectrics or organic dielectrics and the planar capacitor structure and method of formation can advantageously be inserted at any level of the BEOL.

The dielectric layer 102 may be porous or non-porous. Examples of suitable dielectrics that can be used as the dielectric layer 102 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

In one or more embodiments, the dielectric layer 102 has a dielectric constant of about 4.0 or less. In other embodiments, the dielectric layer 102 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

A first bottom electrode 104 (also shown as BE1) is formed on the top surface of the dielectric layer 102. In one or more embodiments, the first bottom electrode 104 is a conductive material. Conductive materials suitable for the first electrode of the capacitor structure include, but are not limited to, Ta, Ru, Co, Pt, W, Rh, Ir, Au, Al, Ti, nitrides thereof, and an alloy of two or more of the foregoing materials. In one or more embodiments, the first electrode is TiN. The first bottom electrode 104 may be formed by first depositing a layer of the first electrode material utilizing a conventional deposition process such as, for example, PVD, CVD, PECVD, an atomic layer deposition (ALD) process, or a plasma enhanced atomic layer deposition (PEALD). Typically, the first electrode has a thickness from about 5 nm to about 100 nm, with a thickness from about 20 nm to about 40 nm being more typical.

A layer of the first electrode material can be patterned by a lithographic process to form the first bottom electrode 104. For example, a photoresist (not shown) can be formed atop the first electrode layer by a conventional deposition process such as, for example, spin-on coating or chemical solution deposition. The photoresist may be a positive-tone or a negative-tone photoresist. The photoresist is then subjected to a lithographic process which includes exposing the photoresist to a pattern of radiation and developing the exposed resist utilizing a conventional resist developer. The lithographic step provides a patterned photoresist atop the layer of first electrode material that will be used to define the width of the first electrode 104. The pattern is transferred into the first electrode layer utilizing one or more etching processes to form the first electrode 104.

The patterned photoresist can be stripped immediately after the electrode pattern is transferred by utilizing a conventional stripping and/or plasma ashing process. The etching used in transferring the electrode pattern may comprise a dry etching process, a wet chemical etching process or a combination thereof. The term "dry etching" is used herein to denote an etching technique such as reactive-ion etching, ion beam etching, plasma etching, or laser ablation.

Figure 4:
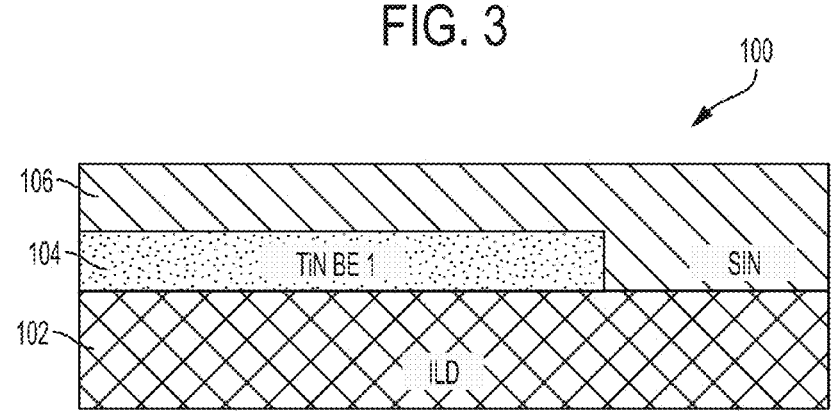
FIG. 4 illustrates a cross-sectional view of 3D via stacked planar capacitors after another processing stage, in accordance with embodiments of the present invention.
Figure 5:
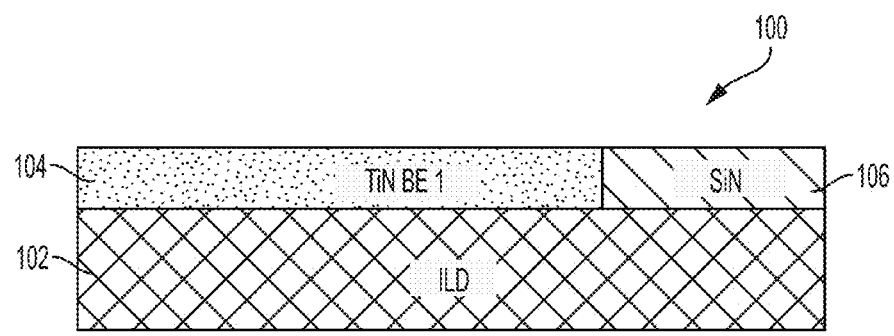
FIG. 5 illustrates a cross-sectional view of 3D via stacked planar capacitors after another processing stage, in accordance with embodiments of the present invention.

In FIG. 4, a layer of first isolation material 106 is then deposited onto the structure 100 at a thickness greater than the thickness of the first electrode 104. In FIG. 5, the layer of first isolation material 106 is polished such as by chemical mechanical polishing (CMP) to provide first isolation regions 106 having a thickness equal to the first electrode 104 so as to form a flat surface. That is, the first electrode 104 has a top surface that is coplanar with the top surface of the isolation region 106. The isolation material defining the isolation region 106 can be a dielectric material such as, for example, an oxide such as $SiO_2$ to a nitride such as $Si_3N_4$. The isolation layer can be formed utilizing a conventional deposition process such as, for example, CVD, PECVD, chemical solution deposition or evaporation. The thickness of the as-deposited isolation layer 106 may vary depending upon the type of isolation material formed and the deposition technique used in forming the same. By way of example, the as-deposited isolation layer has a thickness prior to CMP from about 15 nm to about 300 nm, with a thickness from about 60 nm to about 120 nm being more typical.

The CMP process generally includes polishing the isolation layer stopping at the first electrode 104. CMP is a planarization process for smoothing surfaces with the combination of chemical and mechanical forces. The process generally includes an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation. This removes excess isolation material and tends to even out any irregular topography, making the wafer flat or planar. The particular CMP process is not intended to be limited and will generally depend on the materials used to define the first electrode 104 and first isolation region 106.

As will be discussed in greater detail below, the first electrode 104 and first isolation regions 106 will be configured as the first bottom electrode (BE1) in the capacitor structure of the present invention.

Optionally, the isolation region 106 may be formed prior to forming the first bottom electrode 104. In this optional embodiment, a layer defining the isolation region would be deposited and lithographically patterned. The first electrode 104 would be deposited at a thickness about equal to the isolation region 106. The resulting structure may be polished to provide a co-planar surface to the first bottom electrode 104 and the isolation region 106 as well as to remove any excess tungsten.

Figure 6:
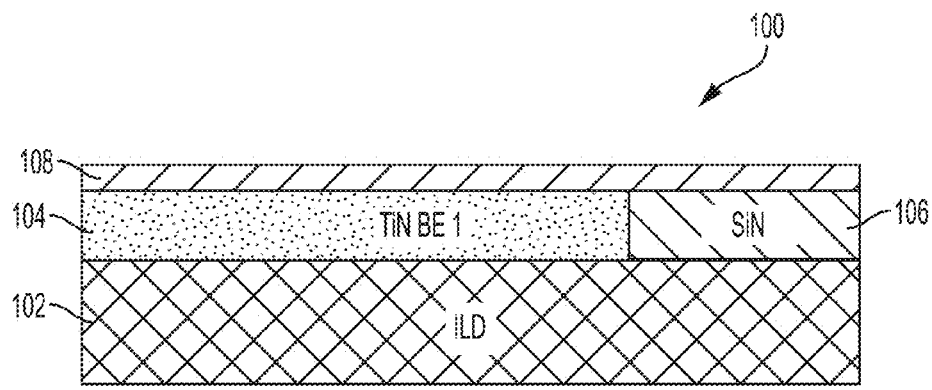
FIG. 6 illustrates a cross-sectional view of 3D via stacked planar capacitors after another processing stage, in accordance with embodiments of the present invention.

In FIG. 6, a first high-k dielectric material layer 108 is then formed on the layer defined by the first electrode 104 and the first isolation region 106. Materials suitable for the first high-k dielectric layer include, but are not limited to, oxide-nitride-oxide, $SiO_2$, $Ta_2O_5$, $Si_3N_4$, SiON, $ZrO_2$, ZrAlO, ZrSiO, HfAlO, $HfO_2$, $HfSiO_2$, $Al_2O_3$, and any combination of two or more of the foregoing materials. In one or more embodiments, the first high-k dielectric material layer has a dielectric constant of about 5 to about 60. In other embodiments, the first high-k dielectric material layer has a dielectric constant of about 8 to about 40. The dielectric constants mentioned herein are measured in a vacuum. The first high-k dielectric material layer may be formed utilizing a conventional deposition process such as, for example, CVD, PECVD, ALD, or PEALD. Because the underlying first electrode 104 and isolation region 106 have coplanar top surfaces without any stepped heights, the first high-k dielectric material layer 108 can have an aggressive EOT scaling. In one or more embodiments, the first high k dielectric layer 108 thickness is from about 2 nm to about 8 nm, with a thickness from about 4 nm to about 6 nm being more typical.

Figure 7:
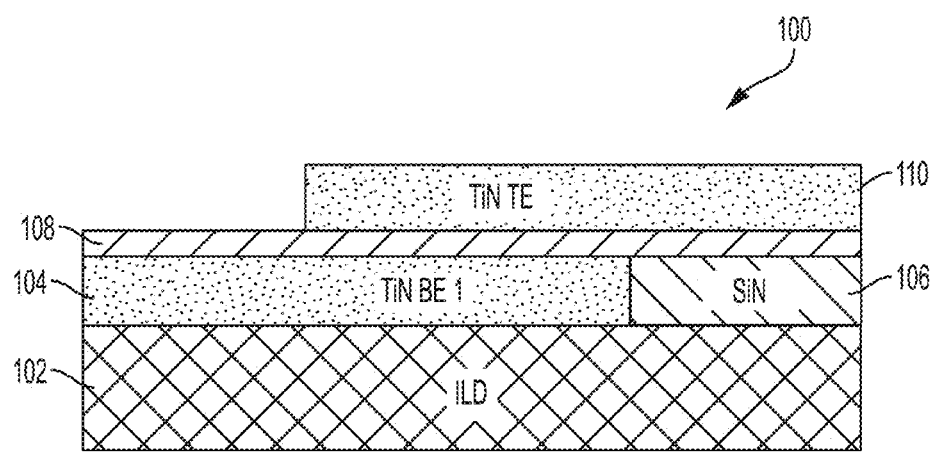
FIG. 7 illustrates a cross-sectional view of 3D via stacked planar capacitors after another processing stage, in accordance with embodiments of the present invention.
Figure 8:
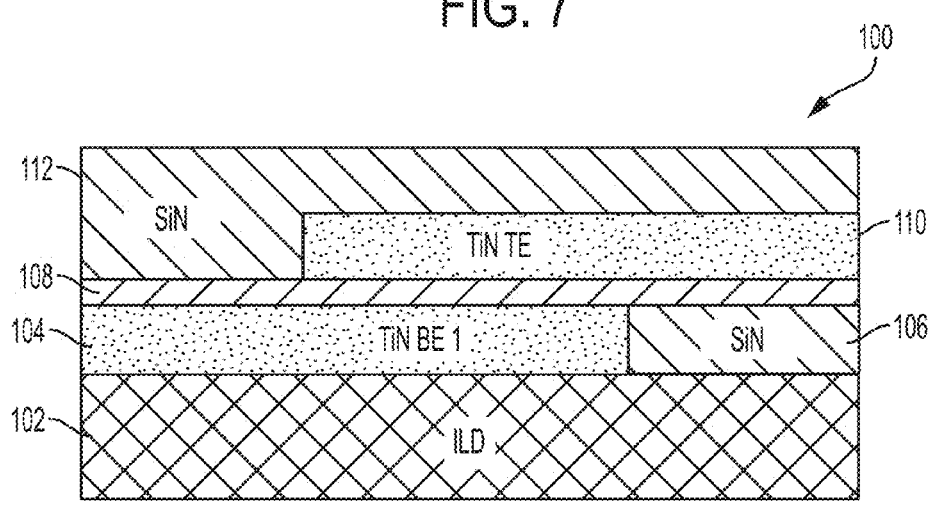
FIG. 8 illustrates a cross-sectional view of 3D via stacked planar capacitors after another processing stage, in accordance with embodiments of the present invention.

In FIG. 7, a second electrode 110 is formed in the same manner as the first bottom electrode 104 discussed previously herein. In FIG. 8, a second isolation region 112 is formed in the same manner as the first isolation region 106 discussed above. More specifically, a layer of the second electrode material is deposited onto the high k dielectric layer 108 and patterned as described above. The second electrode material can be the same material or a different material used to define the first electrode 104. A portion of the second electrode 110 layer overlays the first electrode 104 and will be configured as the top (middle) electrode (TE) in the capacitor structure 100. As shown, the portion of the second electrode 110 overlays the one side of the cross sectional view of the first bottom electrode 104.

Figure 9:
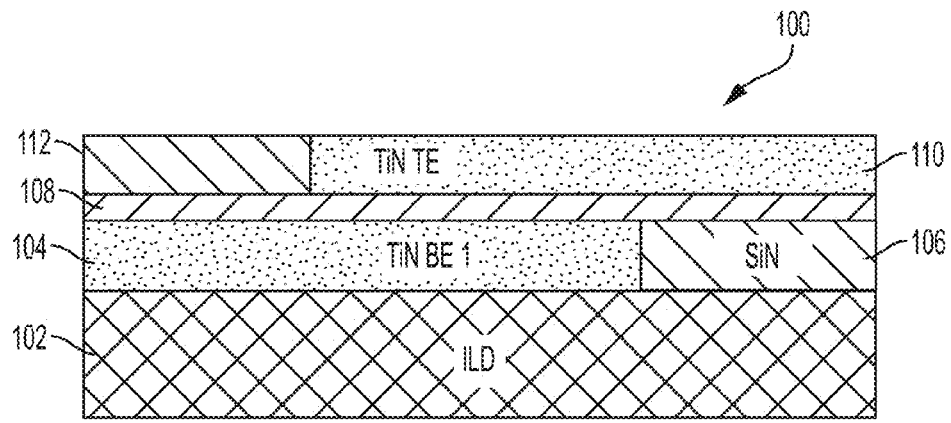
FIG. 9 illustrates a cross-sectional view of 3D via stacked planar capacitors after another processing stage, in accordance with embodiments of the present invention.

As shown in FIG. 8, a layer of second isolation material is then deposited at a thickness greater than the second electrode 110 onto the structure 100. As shown in FIG. 9, the second isolation material is polished such as by chemical mechanical polishing (CMP) to provide second isolation region 112 having a thickness equal to the second electrode so as to form a flat surface. That is, the second electrode 110 has a top surface that is coplanar with the top surface of the second isolation region 112. The isolation material can be a dielectric material such as, for example, an oxide such as $SiO_2$ to a nitride such as $Si_3N_4$. The second isolation material can be the same material or a different material used to define the first isolation region 106. The isolation layer can be formed utilizing a conventional deposition process such as, for example, CVD, PECVD, chemical solution deposition or evaporation. The thickness of the as-deposited isolation layer may vary depending upon the type of isolation material formed and the deposition technique used in forming the same. By way of example, the as-deposited isolation layer has a thickness from about 15 nm to about 300 nm, with a thickness from about 60 nm to about 120 nm being more typical.

The CMP process generally includes polishing the isolation layer stopping at the second electrode 110.

Optionally, the isolation region 112 may be formed prior to forming the second bottom electrode 110. In this optional embodiment, a layer defining the isolation region 112 would be deposited and lithographically patterned. The second bottom electrode 110 would then be deposited at a thickness about equal to the isolation region 112. The resulting structure may be polished to provide a co-planar surface to the second bottom electrode 110 and the isolation region 112 as well as to remove any excess tungsten.

Figure 10:
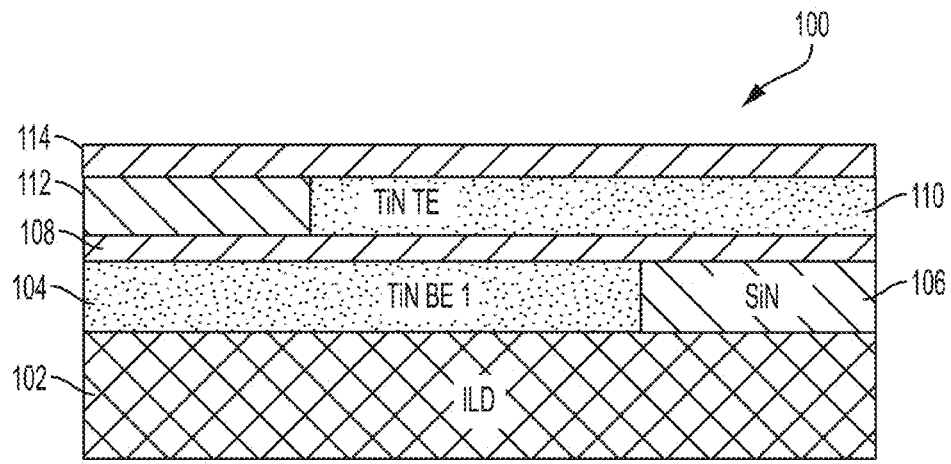
FIG. 10 illustrates a cross-sectional view of 3D via stacked planar capacitors after another processing stage, in accordance with embodiments of the present invention.

In FIG. 10, a second high-k dielectric material layer 114 is then formed over the planar surface of the second electrode 110 and second isolation region 112. Materials suitable for the second high-k dielectric layer include, but are not limited to, oxide-nitride-oxide, $SiO_2$, $Ta_2O_5$, $Si_3N_4$, SiON, $ZrO_2$, $HfO_2$, $HfSiO_2$, $Al_2O_3$, and any combination of two or more of the foregoing materials. The second high-k dielectric material layer 114 can be the same material or a different material as the first high-k dielectric material layer 108. In one or more embodiments, the second high-k dielectric material layer has a dielectric constant of about 5 to about 60. In other embodiments, the first high-k dielectric material layer has a dielectric constant of about 8 to about 40. The first high-k dielectric material layer may be formed utilizing a conventional deposition process such as, for example, CVD, PECVD, ALD, or PEALD. In one or more embodiments, the second high k dielectric layer 114 has a thickness from about 2 nm to about 8 nm, with a thickness from about 4 nm to about 6 nm being more typical. In one or more embodiments, the thickness of the second dielectric layer 114 is the same as the first high k dielectric layer 108.

Figure 11:
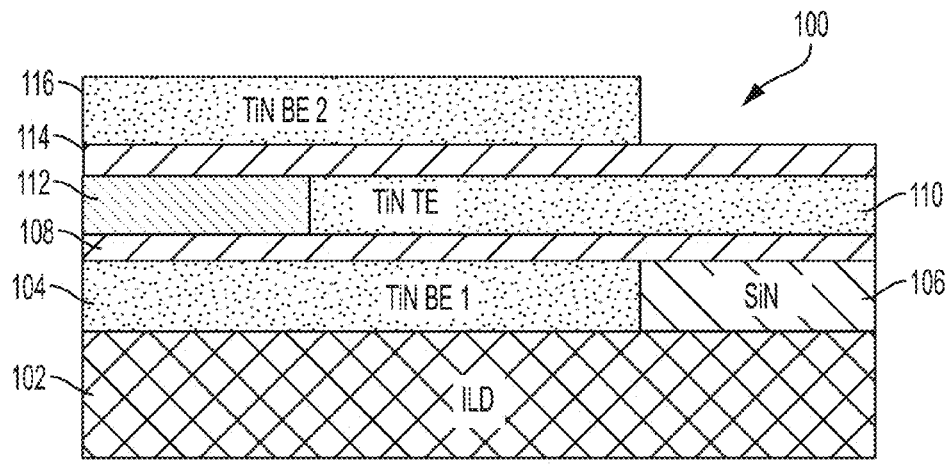
FIG. 11 illustrates a cross-sectional view of 3D via stacked planar capacitors after another processing stage, in accordance with embodiments of the present invention.

In FIG. 11, a third electrode 116 (which will function as the second bottom electrode (BE2)) is formed on the second high k dielectric layer 114. A layer of the third electrode material is deposited onto the third high k dielectric layer 114 and patterned as described above. The third electrode material can be the same material or a different material used to define the first and second electrodes 104, 110, respectively. The third electrode 116 has the same width as the first electrode 104 and is aligned therewith. As will be discussed in greater detail below, the third electrode 116 will be configured as the second bottom electrode (BE2) in the capacitor structure.

Figure 12:
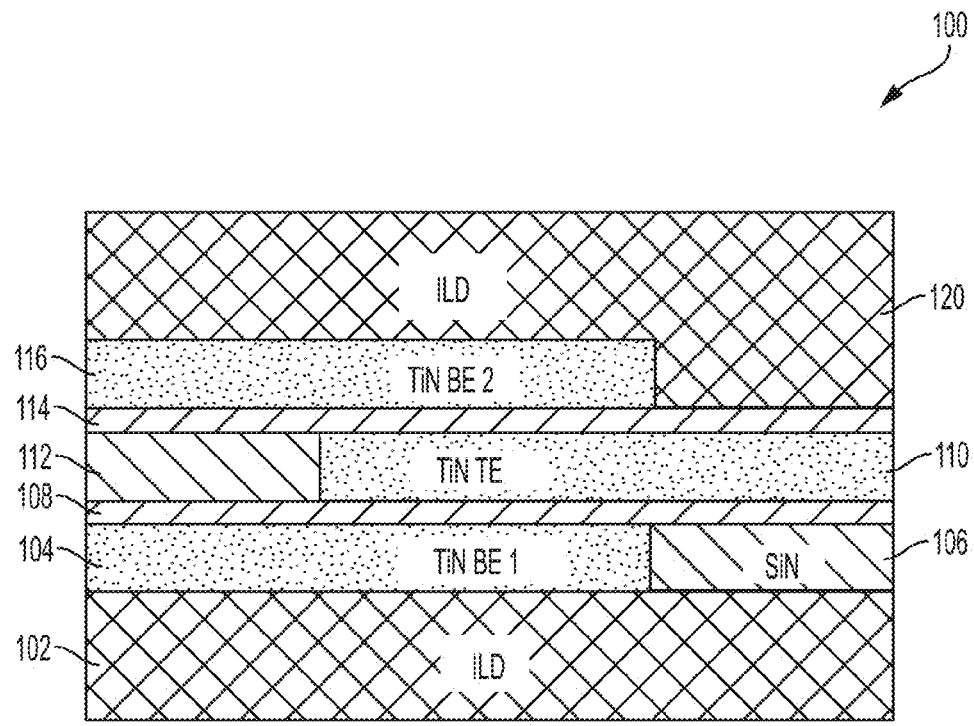
FIG. 12 illustrates a cross-sectional view of 3D via stacked planar capacitors after another processing stage, in accordance with embodiments of the present invention.

In FIG. 12, dielectric layer 120 is deposited onto the structure 100. The dielectric layer 120 is similar to or the same as dielectric layer 102 and may be any one of the interlevel or intralevel dielectrics typically utilized at the back end of line (BEOL).

Figure 13:
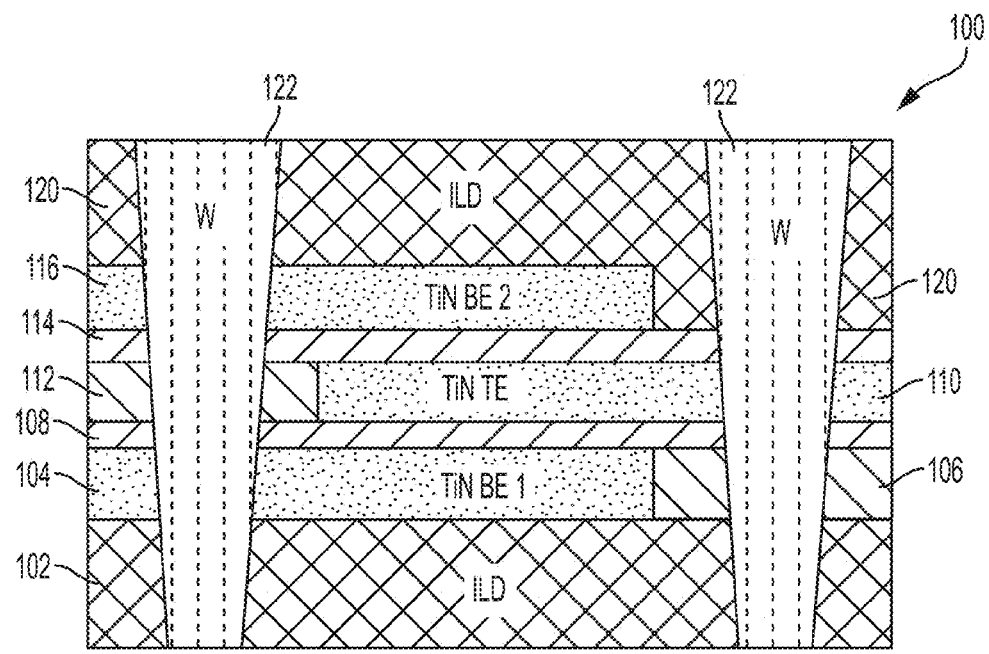
FIG. 13 is a cross-sectional view of an array of two 3D via stacked planar capacitors formed by the processing stages of FIGS. 3-12, in accordance with one or more embodiments of the present invention.

In FIG. 13, via contact formation is shown, which uses one or hardmasks to penetrate all of the underlying layers as shown or to separately make contact to the bottommost BE and TE. As such, the vias generally extend from the top of dielectric layer 120 down to the metal lines. To form the vias 122, a patterned hardmask layer (not shown) is first formed atop the upper surface of the dielectric layer 120, e.g., the ILD. The hardmask layer can include an oxide, nitride, oxynitride, or a combination of two or more of the foregoing materials. In some embodiments, the hardmask layer may have a single layer or multilayer structure. In one or more embodiments, the hardmask layer is an oxide such as $SiO_2$ or a nitride such as $Si_3N_4$. The hardmask layer can be formed utilizing a conventional deposition process such as, for example, CVD, PECVD, chemical solution deposition or evaporation. The thickness of the as-deposited hardmask layer may vary depending upon the type of hardmask material formed, the number of layers that make up the hardmask layer, the deposition technique used in forming the same, as well as the via formation process. Typically, the as-deposited hardmask layer has a thickness from about 10 nm to about 80 nm, with a thickness from about 20 nm to about 60 nm being more typical.

The hardmask layer can be patterned by a lithographic process. A photoresist (not shown) is formed atop the hardmask layer by a conventional deposition process such as, for example, spin-on coating or chemical solution deposition. The photoresist may be a positive-tone or a negative-tone photoresist. The photoresist is then subjected to a lithographic process which includes exposing the photoresist to a pattern of radiation and developing the exposed resist utilizing a conventional resist developer. The lithographic step provides a patterned photoresist atop the hardmask layer that defines the width of the via 122. The via pattern is transferred into the hardmask layer and then subsequently into the underlying layers utilizing one or more etching processes.

The patterned photoresist can be stripped immediately after the via pattern is transferred into the hardmask layer by utilizing a conventional stripping and/or plasma ashing process. The etching used in transferring the via pattern into the various layers, e.g., layers 102, 104, 108, 112, 114, 116, 120 for contact formation with the bottom electrodes (BE1, BE2), and layers 102, 106, 108, 110, 114, 120 for contact formation with the top electrode (TE). The etching process may comprise a dry etching process, a wet chemical etching process or a combination thereof. The term "dry etching" is used herein to denote an etching technique such as reactive-ion etching, ion beam etching, plasma etching, or laser ablation.

The vias 122 are filled with a conductive metal. Typically, a tungsten layer is deposited into the via 122 using a chemical vapor deposition process or physical vapor deposition sputtering process. Then, either a metal chemical mechanical polishing (CMP) or an etch back technique is used to remove any tungsten lying outside the vias.

Structure 100 in FIG. 13 advantageously utilizes 4 mask levels to form the 2 parallel capacitors as shown. It should be apparent that additional capacitors can be easily fabricated by repeating the formation of the bottom top electrodes; the entire structure of which can be inserted at any level of BEOL. In the embodiment shown, the mask levels are utilized for BE1, TE, BE2, and via formation. The vias penetrate through the stacks to make contacts to all bottom electrodes and top electrode(s) separately.

Figure 14:
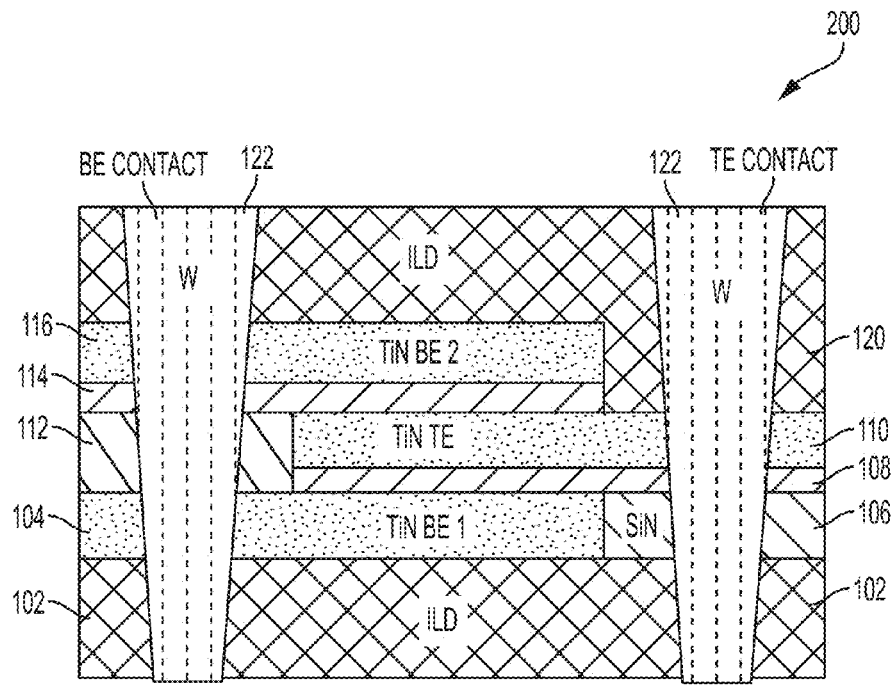
FIG. 14 is a cross-sectional view of an array of two 3D via stacked planar capacitors, in accordance with an embodiment of the present invention.

FIG. 14 illustrates a stacked planar capacitor structure 200 in accordance with another embodiment. In this embodiment, the high k dielectric layers 108 and 114 are patterned prior to subsequent processing. High k dielectric layer 108 is patterned to provide a width equal to a width of the top electrode 110 (TE) so that the edges thereof are aligned and high k dielectric layer 114 is patterned to provide a width equal to the second bottom electrode 116 (BE2) so that the edges thereof are aligned. As in the previous embodiments, the isolation region 112 is made to be coplanar with the top electrode 110 so that the thickness of the isolation region 112 is equal to the combined thickness of the high k dielectric layer 108 and the top electrode 110. Vias 122 are formed in the same manner as capacitor structure 100 above. However, for contact formation with the bottom electrodes (BE1, BE2), the via 122 extends through layers 102, 104, 112, 114, 116, and 120, i.e., there is no high k dielectric layer 112 in the contact formation with the bottom electrodes (BE1, BE2).

Figure 15:
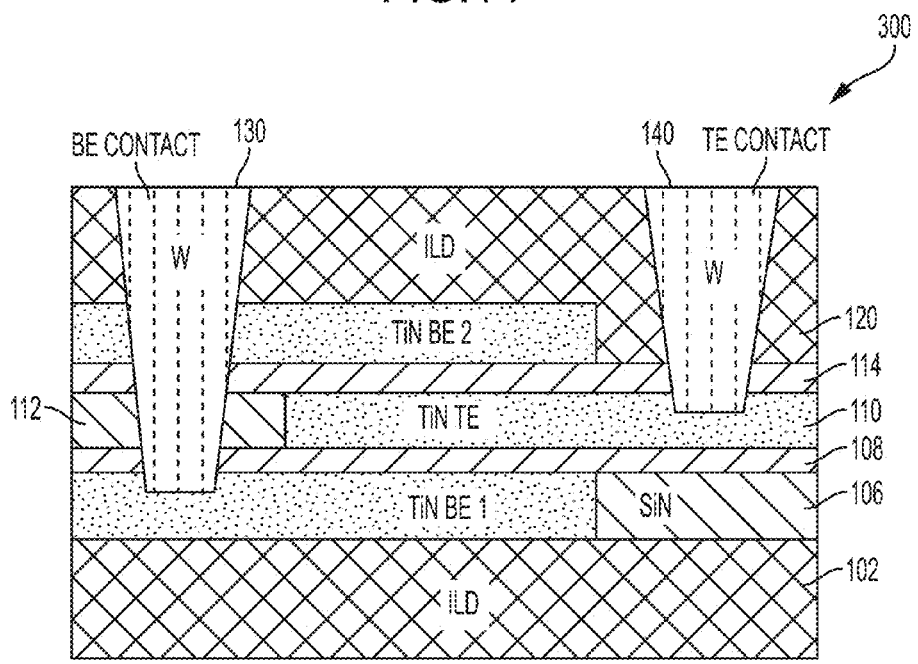
FIG. 15 is a cross-sectional view of an array of two 3D via stacked planar capacitors, in accordance with an embodiment of the present invention.

FIG. 15 illustrates a stacked planar capacitor structure 300 in accordance with another embodiment. In this embodiment, the vias 130, 140 are formed in the same manner as that described above but are selectively stopped at the bottom most bottom electrode 104 (BE1) and top electrode 110 (TE) to make separate contacts. As a result, an additional mask level is utilized to form the separate vias. The mask levels include BE1, TE, BE2, BE via formation and TE via formation.

Figure 16:
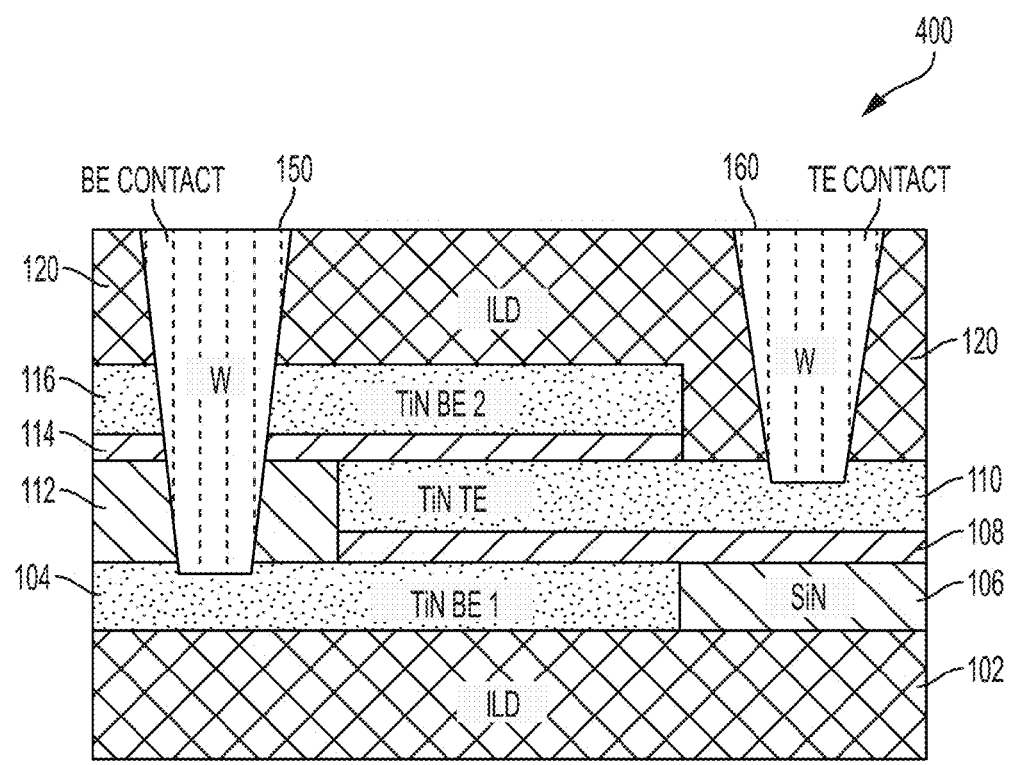
FIG. 16 is a cross-sectional view of an array of two 3D via stacked planar capacitors, in accordance with an embodiment of the present invention.

FIG. 16 illustrates a stacked planar capacitor structure 400 in accordance with another embodiment. In this embodiment, the high k dielectric layers 108 and 114 are patterned prior to subsequent processing. High k dielectric layer 108 is patterned to provide a width equal to a width of the top electrode 110 (TE) so that the edges thereof are aligned and high k dielectric layer 114 is patterned to provide a width equal to the second bottom electrode 116 (BE2) so that the edges thereof are aligned. In addition, the vias 150, 160 are selectively stopped at the bottom most bottom electrode 104 (BE1) and top electrode 110 (TE), respectively, to make separate contacts therewith. As a result, an additional mask level is utilized to form the separate vias. The mask levels include BEJ, TE, BE2, BE via formation and TE via formation.

As described, the stacked planar capacitor structure includes at least two capacitors that share a middle electrode, i.e., top electrode 110, which results in each capacitor being in a different area. The stacked planar capacitor structures generally includes a first capacitor formed on an interlevel or an intralevel dielectric of BEOL comprising a first layer defined by a first bottom electrode and a first isolation region, wherein the first electrode and the first isolation region are of equal thickness; a second layer defined by a middle electrode and a second isolation region, wherein the middle electrode and the second isolation region are of equal thickness, and wherein the middle electrode overlays a portion of the first bottom electrode, and a first high k dielectric layer intermediate the first and second layers. A second capacitor includes a third layer defined by a second bottom electrode, the second layer defined by the middle electrode and the second isolation region; and a high k dielectric layer intermediate the third layer and the second layer. Consequently, the first and second bottom electrodes, and the middle electrode are stackedly arranged vertically, wherein the first and second bottom electrodes have the same width and are vertically aligned with each other, and wherein the first and second capacitors share the middle electrode, which overlays a portion of the first and second bottom electrodes. Stacking of additional electrodes is feasible given that there is no step height utilized in the structure that would affect current leakage and provide reliability issues.

Advantageously, the capacitor structures provide no high k dielectric corners that can lead to leakage and reliability issues. The capacitor structures can be integrated into the BEOL and are typically disposed in close proximity to the interconnects. In one or more embodiments, the capacitor structures are located close to the power and ground nodes (or whichever nodes are being decoupled) to reduce the parasitic inductance.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming a stacked planar capacitor at BEOL, comprising:
    providing a substrate including a first dielectric layer;
    forming a first electrode and a first isolation region on the first dielectric layer, wherein the first electrode has a thickness equal to the first isolation region;
    forming a first high-k dielectric material layer on the first electrode and the first isolation region layer;
    forming a second electrode and a second isolation region on the first high dielectric layer, wherein the second electrode has a thickness equal to the second isolation region;
    forming a second high-k dielectric material layer on the second electrode and the second isolation region, wherein the second electrode overlays a portion of the first electrode;
    forming a third electrode on the second high dielectric layer, wherein the third electrode has a thickness equal to a thickness of the second isolation region, and wherein the third electrode has a width equal to the first electrode and is vertically aligned therewith;
    forming a second dielectric layer on the third electrode and an exposed portion of the second high k dielectric layer;
    forming a first vertical via to the first and third electrodes;
    forming a second vertical via to the second electrode; and
    filling the first and second vertical vias with a conductive material to form the stacked planar capacitor.

2. The method of claim 1, wherein forming the first and second vertical via is simultaneous.

3. The method of claim 1, wherein the first vertical via stops at the first electrode, and the second vertical via stops at the second electrode.

4. The method of claim 1, wherein forming the first high-k dielectric material layer comprises patterning the first high k dielectric layer to have a width equal to the second electrode, wherein the second electrode is vertically aligned therewith, and wherein the second isolation region is at a thickness equal to a combined thickness of the second electrode and the high k dielectric layer such that the second isolation region has a top surface coplanar to a top surface of the second electrode.

5. The method of claim 4, further comprising patterning the second high k dielectric layer to have a width equal to the third electrode during the forming of the second high-k dielectric material layer, wherein the third electrode is vertically aligned therewith.

6. The method of claim 5, wherein the first vertical via stops at the first electrode, and the second vertical via stops at the second electrode.

7. The method of claim 1, wherein the first and second high k dielectric layers comprise oxide-nitride-oxide, $SiO_2$, $Ta_2O_5$, $Si_3N_4$, SiON, $ZrO_2$, $HfO_2$, $HfSiO_2$, $Al_2O_3$, and any combination of two or more of the foregoing materials.

8. The method of claim 1, wherein the first, second, and third electrodes comprise titanium nitride.

9. The method of claim 1, wherein said first high-k dielectric material layer and said second high-k dielectric material layer are formed from the same dielectric material, said dielectric material comprises oxide-nitride-oxide, $SiO_2$, $Ta_2O_5$, $Si_3N_4$, SiON, $ZrO_2$, $HfO_2$, $Al_2O_3$, or any combination of two or more of the foregoing materials.

10. The method of claim 1, wherein said forming the first and second high-k dielectric material layers comprises a chemical vapor deposition (CVD), a plasma enhanced chemical vapor deposition (PECVD), an atomic layer deposition (ALD) process, or a plasma enhanced atomic layer deposition (PEALD).

11. The method of claim 1, wherein the first, second, and third electrodes comprise Ta, Ru, Co, Pt, W, Rh, Ir, Au, Al, Ti, nitrides thereof or an alloy of two or more of the foregoing materials.

12. The method of claim 1, further comprising
forming a third isolation region on the second high dielectric layer, wherein the third electrode has a thickness equal to the third isolation region;
forming at least one additional high-k dielectric material layer on the third electrode and the third isolation region;
forming at least one additional electrode and at least one additional isolation region on the third high k dielectric layer, wherein the at least one additional electrode has a thickness equal to the at least one additional isolation region; wherein the at least one additional electrode overlays at least a portion of the third electrode, and wherein the at least one additional electrode has a width equal to the second electrode and is vertically aligned therewith.

13. The method of claim 1, wherein filling the first and second vertical vias with the conductive material comprises depositing Cu, Al, W, Ru, Rh, Ir, Co, or an alloy comprising two or more of the foregoing metals.

14. The method of claim 1, wherein forming the first electrode and the first isolation region on the first dielectric layer comprises patterning the first electrode on the first dielectric layer; depositing a layer of a material defining the isolation region onto the patterned first electrode, wherein the layer of the material defining the isolation region is at a thickness greater than a thickness of the first electrode; and polishing the layer such that the thickness of the isolation region is equal to the thickness of the first electrode.

15. A stacked planar capacitor structure comprising at least two capacitors, the stacked planar capacitor structure comprising:
a first capacitor formed on an interlevel or an intralevel dielectric of BEOL comprising a first layer defined by a first bottom electrode and a first isolation region, wherein the first electrode and the first isolation region are of equal thickness; a second layer defined by a middle electrode and a second isolation region, wherein the middle electrode and the second isolation region are of equal thickness, and wherein the middle electrode overlays a portion of the first bottom electrode; and a first high k dielectric layer intermediate the first and second layers; and
a second capacitor comprising a third layer defined by a second bottom electrode; the second layer defined by the middle electrode and the second isolation region; and a high k dielectric layer intermediate the third layer and the second layer;
wherein the first and second bottom electrodes and the middle electrode are stackedly arranged vertically, wherein the first and second bottom electrodes have the same width and are vertically aligned with each other, and wherein the first and second capacitors share the middle electrode.

16. The stacked planar capacitor structure of claim 15, further comprising a first vertical metal contact between at least the first bottom electrode and the second bottom electrode; and a second vertical metal contact to the middle electrode.

17. The stacked planar capacitor structure of claim 15, wherein the first and second high k dielectric layers comprise oxide-nitride-oxide, $SiO_2$, $Ta_2O_5$, $Si_3N_4$, SiON, $ZrO_2$, $HfO_2$, $HfSiO_2$, $Al_2O_3$, and any combination of two or more of the foregoing materials.

18. A stacked planar capacitor structure comprising at least two capacitors, the stacked planar capacitor structure comprising:
a first capacitor formed on an interlevel or an intralevel dielectric of BEOL comprising:
a first layer defined by a first bottom electrode and a first isolation region, wherein the first electrode and the first isolation region are of equal thickness;
a first high k dielectric layer offset from and overlaying a portion of the first bottom electrode;
a middle electrode vertically aligned with and of an equal width as the first high k dielectric layer; and
a second isolation region abutting the middle electrode having a thickness equal to the middle electrode and the first high k dielectric layer such that the second isolation region has an upper surface coplanar with the middle electrode; and
a second capacitor comprising:
a third layer defined by a second bottom electrode;
the middle electrode; and
a second high k dielectric layer intermediate the third layer and the middle electrode; the second high k dielectric layer offset from and overlaying a portion of the middle electrode, wherein the second bottom electrode is vertically aligned with and of an equal width as the second high k dielectric layer and the first bottom electrode,
wherein the first and second capacitors share the middle electrode.

19. The stacked planar capacitor structure of claim 15, further comprising a first vertical metal contact between at least the first bottom electrode and the second bottom electrode; and a second vertical metal contact to the middle electrode.

20. The stacked planar capacitor structure of claim 15, wherein the first and second high k dielectric layers comprise oxide-nitride-oxide, $SiO_2$, $Ta_2O_5$, $Si_3N_4$, SiON, $ZrO_2$, $HfO_2$, $HfSiO_2$, $Al_2O_3$, and any combination of two or more of the foregoing materials.

* * * * *